(12) United States Patent
Molnar et al.

(10) Patent No.: US 6,388,543 B1
(45) Date of Patent: May 14, 2002

(54) SYSTEM FOR EIGHT-PHASE 45° POLYPHASE FILTER WITH AMPLITUDE MATCHING

(75) Inventors: Alyosha C. Molnar, Costa Mesa; Rahul Magoon, Irvine, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/666,501

(22) Filed: Sep. 18, 2000

(51) Int. Cl.⁷ .................................................. H03H 7/21
(52) U.S. Cl. ........................ 333/172; 323/370; 323/109; 323/112
(58) Field of Search .............................. 333/172, 109, 333/112; 307/13, 14; 323/370

(56) References Cited

U.S. PATENT DOCUMENTS

| | | | | | |
|---|---|---|---|---|---|
| 3,559,042 A | * | 1/1971 | Gingell | .................... | 323/218 |
| 3,618,133 A | * | 11/1971 | Gingell | .................... | 333/24 |
| 4,123,712 A | * | 10/1978 | Mikhael | .................... | 325/137 |
| 4,326,109 A | * | 4/1982 | McGee et al. | .................... | 179/170 NC |
| 4,647,843 A | * | 3/1987 | Gawargy | .................... | 323/370 |
| 4,893,035 A | * | 1/1990 | Reynolds et al. | .................... | 307/520 |
| 5,084,686 A | | 1/1992 | Chun | .................... | 333/138 |
| 5,608,796 A | | 3/1997 | Banu et al. | .................... | 379/403 |
| 5,715,529 A | | 2/1998 | Kianush et al. | .................... | 455/266 |
| 6,031,739 A | | 2/2000 | He et al. | .................... | 363/44 |

* cited by examiner

Primary Examiner—Justin P. Bettendorf
Assistant Examiner—Joseph Chang
(74) Attorney, Agent, or Firm—Welsh & Katz, Ltd (57) ABSTRACT

A system for an eight-phase 45° polyphase filter with amplitude matching, where a full eight-phase 45° split may be achieved by tying together the inputs of two offset four-phase 90° phase splitters. Amplitude matching may be achieved by obtaining those inputs from an additional single four-phase 90° phase splitter. The additional phase splitter can distribute power evenly among the inputs of the two offset phase splitters so as to cancel out the occurrence of any uneven power distribution.

21 Claims, 4 Drawing Sheets

Fig. 1

*Prior Art*

*Prior Art*

SYSTEM FOR EIGHT-PHASE 45° POLYPHASE FILTER WITH AMPLITUDE MATCHING

BACKGROUND OF THE INVENTION

1. Field of the Invention

This invention relates to polyphase filters and, more specifically, to an eight-phase 45° polyphase filter with amplitude matching.

2. Related Art

Certain radio receiver architectures require that signals be phase split equally into eight separate phases with constant 45° phase splits between them. For example, direct conversion receivers and subharmonic frequency translators for use in such receivers may have such requirements. In addition, preprocessors for improving the switching characteristics of a local oscillator input to such frequency translators may also have these requirements.

One of the most common and most reliable ways of achieving phase splits in general is through the use of passive RC filters, that are commonly called polyphase filters. In the simplest RC series circuit, the voltage across the capacitor will lag the current, and the voltage across the resistor, by 90°. In a differential RC phase splitter, the two inputs are 180° out of phase with each other and four outputs are available, each of which has a phase angle difference of 90° relative to the next output.

By selecting the resistor and capacitor values, the phase angle of an output voltage relative to an input voltage can be achieved for a particular frequency. The inputs of two differential RC phase splitters can be connected. The resistor and capacitor values of the two phase splitters can be selected so that there is a 45° phase angle difference between an output of the first phase splitter and a corresponding output of the second phase splitter at a particular frequency. The result is eight outputs with 45° phase splits between them at a particular frequency.

The four outputs that are available from a differential RC phase splitter can be amplitude matched at a particular frequency by selection of appropriate resistor and capacitor values. However, the resistor and capacitor values cannot, in general, be selected to achieve both amplitude matching and a particular phase difference relative to the input.

SUMMARY

A full eight-phase 45° split is achieved by tying together the inputs of two offset four-phase 90° phase splitters. The resistor and capacitor values are selected to obtain the 45° phase angle difference between corresponding outputs of the two offset phase splitters. Amplitude matching is achieved by obtaining the inputs for that stage of the polyphase filter from an additional single four-phase 90° phase splitter, whose resistor and capacitor values are selected to achieve amplitude matching. At a particular frequency, the additional phase splitter can distribute power evenly among the four inputs of the two offset phase splitters, so as to cancel out an uneven power distribution which otherwise would occur between the outputs of the two offset phase splitters.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention.

DETAILED DESCRIPTION

Figure 1:
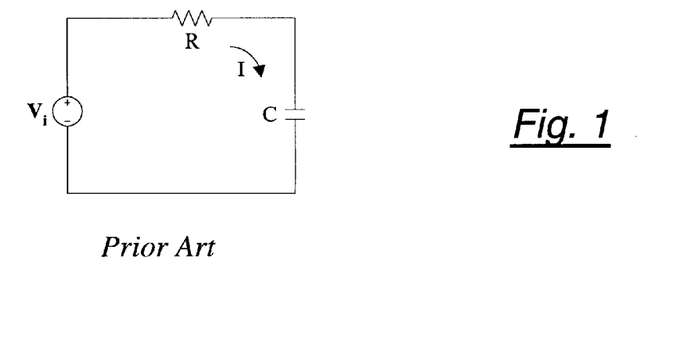
FIG. 1 is a circuit diagram of an RC series circuit with a sinusoidal voltage source.
Figure 2:
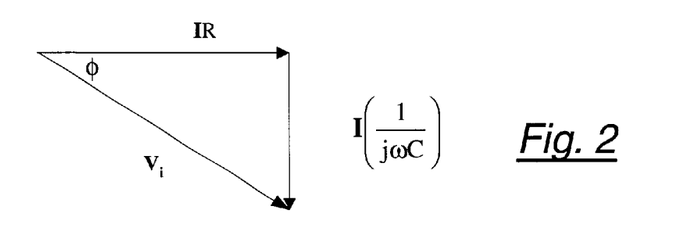
FIG. 2 is a phasor diagram of voltages in FIG. 1.

FIG. 1 is a circuit diagram, for discussion purposes, of a prior art RC series circuit with a sinusoidal voltage source $V_i$ (bolding indicates a phasor) driving a current I through resistor R and capacitor C. FIG. 2 is a phasor diagram of voltages in FIG. 1. The voltage across resistor R is IR, and the voltage across capacitor C is $I(1/j\omega C)$. $V_i = IR + I(1/j\omega C)$. The voltage across R, IR, always leads $V_i$ by a phase angle $\phi$, and the voltage across C, $I(1/j\omega C)$, always lags IR by 90°. The phase angle $\phi = \arctan(1/\omega RC)$. The voltages across R and across C have equal amplitudes when $R = 1/\omega C$ or $\omega RC = 1$. When that occurs, $\phi = 45°$, and the voltage across R leads $V_i$ by 45° and the voltage across C lags $V_i$ by 45°.

Figure 3:
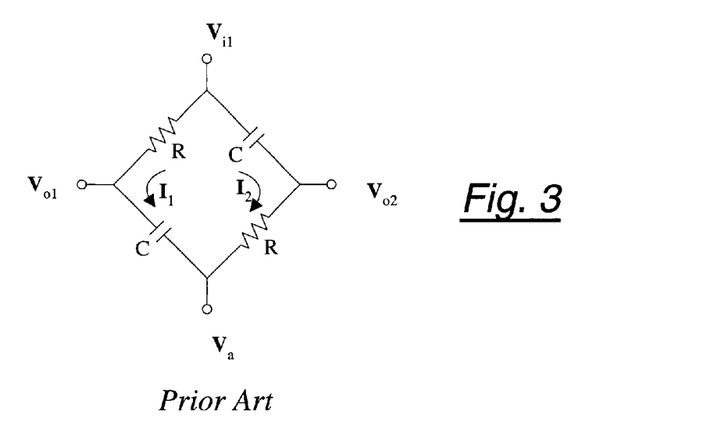
FIG. 3 is a circuit diagram of a two-phase 90° polyphase filter.

FIG. 3 is a circuit diagram, for discussion purposes, of a two-phase 90° polyphase filter. ("Polyphase filter" and "phase splitter" are used interchangeably.) In FIG. 3:

$$V_i = V_{i1} - V_a$$

$$I_1 = I_2 = \frac{V_i}{R + \frac{1}{j\omega C}}$$

$$V_1 = V_{o1} - V_a = I_1\left(\frac{1}{j\omega C}\right) = \frac{V_1}{R + \frac{1}{j\omega C}}\left(\frac{1}{j\omega C}\right) = V_i\frac{1}{1 + j\omega RC}$$

$$V_2 = V_{o2} - V_a = I_2 R = \frac{V_1}{R + \frac{1}{j\omega C}} R = V_i\frac{j\omega RC}{1 + j\omega RC} = V_1(j\omega RC)$$

$V_1$ and $V_2$ are 90° out of phase with respect to each other, regardless of the frequency, the value of R, or the value of C. However, the amplitudes of $V_1$ and $V_2$ are equal only when $\omega RC = 1$, i.e., when $\omega = 1/RC$. When that occurs, the phase angles of $V_1$ and $V_2$ with respect to $V_i$ are $-45°$ and $+45°$, respectively. Each side of FIG. 3 is effectively an RC series circuit as in FIG. 1.

Figure 4:
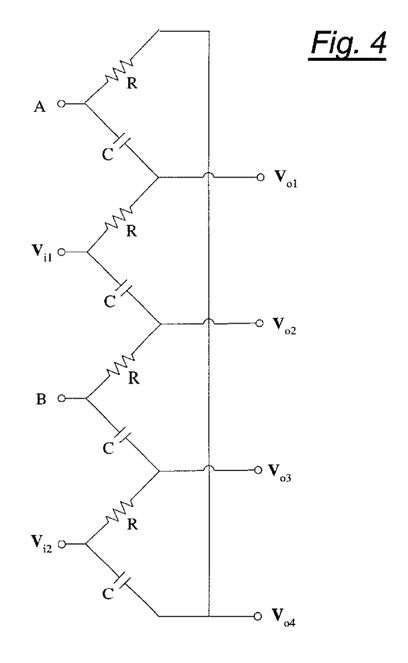
FIG. 4 is a circuit diagram of a four-phase 90° polyphase filter with two inputs.

FIG. 4 is a circuit diagram of a differential four-phase 90° polyphase filter. Inputs $V_{i1}$ and $V_{i2}$ are of equal amplitude and 180° out of phase with each other. As $V_{i1}=-V_{i2}$, as each of the resistors has the same value, and as each of the capacitors has the same value, the symmetry renders points A and B virtual grounds. The circuit of FIG. 4 is a combination of two circuits like the circuit of FIG. 3. Consequently, $V_{o1}$ lags $V_{o2}$ by 90°, and they straddle $V_{i1}$ with respect to phase angle. Similarly, $V_{o3}$ lags $V_{o4}$ by 90°, and they straddle $V_{i2}$ with respect to phase angle. Due to the symmetry again, $V_{o1}$ and $V_{o2}$ are 180° out of phase with $V_{o3}$ and $V_{o4}$, respectively. Therefore, the phase angle of each of the four outputs is 90° different than the next output. As discussed above, amplitude matching occurs only when $\omega=1/RC$. When that occurs, $V_{o1}$, $V_{o2}$, $V_{o3}$ and $V_{o4}$ have phase angles of $-45°$, $45°$, $135°$ and $225°$, respectively, with respect to $V_{i1}$.

Figure 5:
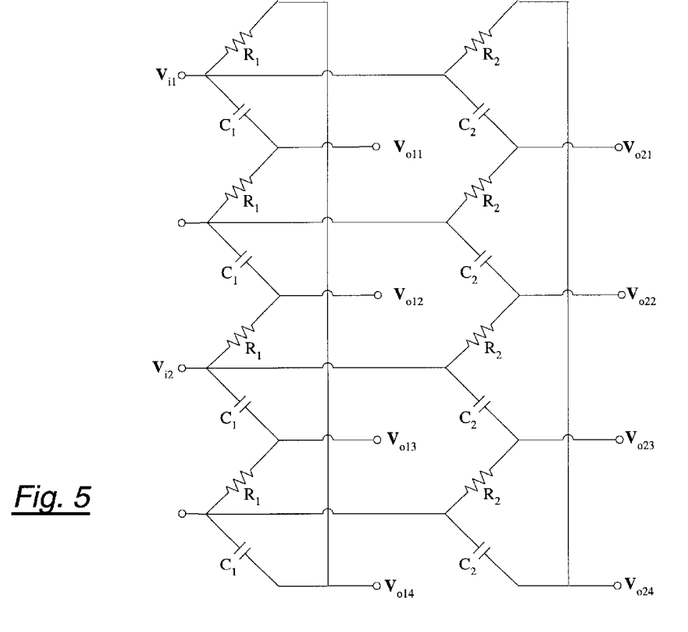
FIG. 5 is a circuit diagram of an eight-phase 45° polyphase filter with two inputs.

FIG. 5 is a circuit diagram of a differential eight-phase 45° polyphase filter. It is a combination of two circuits like the circuit of FIG. 4, with the respective inputs of the two circuits connected and the respective virtual grounds of the two circuits connected. Inputs $V_{i1}$ and $V_{i2}$ are of equal amplitude and 180° out of phase with each other. Each of outputs $V_{o11}$, $V_{o12}$, $V_{o13}$ and $V_{o14}$ is 90° out of phase with the next output and, similarly, each of outputs $V_{o21}$, $V_{o22}$, $V_{o23}$ and $V_{o24}$ is 90° out of phase with the next output.

As illustrated in FIG. 2, the phase angle of an output voltage relative to an input voltage can be achieved for a particular frequency, by selection of the resistor and capacitor values. In the circuit of FIG. 5, the values of $R_1 C_1$ and $R_2 C_2$ can be chosen so that $V_{o21}$, $V_{o22}$, $V_{o23}$ and $V_{o24}$ lead $V_{o11}$, $V_{o12}$, $V_{o13}$ and $V_{o14}$, respectively, by 45° for a particular frequency (for an unloaded filter). For example, $V_{o11}$, leads $V_{i1}$ by 22.5° when $1/\omega R_1 C_1 = \tan 22.50 = 0.41421$, and $V_{o21}$ leads $V_{i1}$ by 67.5° when $1/\omega R_2 C_2 = \tan 67.5° = 2.41421$ (for an unloaded filter). In that case, the phase angles of $V_{o11}$, $V_{o21}$, $V_{o12}$, $V_{o22}$, $V_{o13}$, $V_{o23}$, $V_{o14}$ and $V_{o24}$ are 22.5°, 67.5°, 112.5°, 157.5°, 202.5°, 247.5°, 292.5° and 337.5°, respectively, with respect to $V_{i1}$ for an unloaded filter. In that case:

$$\frac{R_1 C_1}{R_2 C_2} = \frac{\frac{1}{\omega R_2 C_2}}{\frac{1}{\omega R1 C1}} = \frac{2.41421}{0.41421} \cong 5.7$$

$$\left(\frac{1}{\omega R_1 C_1}\right)\left(\frac{1}{\omega R_2 C_2}\right) = (2.41421)(0.41421) = 1$$

(which necessarily follows because 22.5° and 67.5° are complementary angles, and their tangents are reciprocals);

$$\frac{1}{\omega^2 R_1 C_1 R_2 C_2} = 1 \text{ and}$$

$$R_1 C_1 R_2 C_2 = \frac{1}{\omega^2}$$

This example results in eight outputs with 45° phase splits between them at a particular frequency. However, the two relationships:

$$\frac{R_1 C_1}{R_2 C_2} \cong 5.7$$

and $$R_1 C_1 R_2 C_2 = \frac{1}{\omega^2},$$

require that $$\frac{1}{R_1 C_1} < \omega < \frac{1}{R_2 C_2}.$$

That is, with this example neither part of the circuit in FIG. 5 can be at its amplitude matched point. Because inputs $V_{i1}$ and $V_{i2}$ are of equal amplitude and 180° out of phase with each other, amplitude matched outputs could have been achieved if $\omega=$ $$\omega = \frac{1}{RC},$$

but then the desired 45° phase splits between the outputs would not occur.

Figure 6:
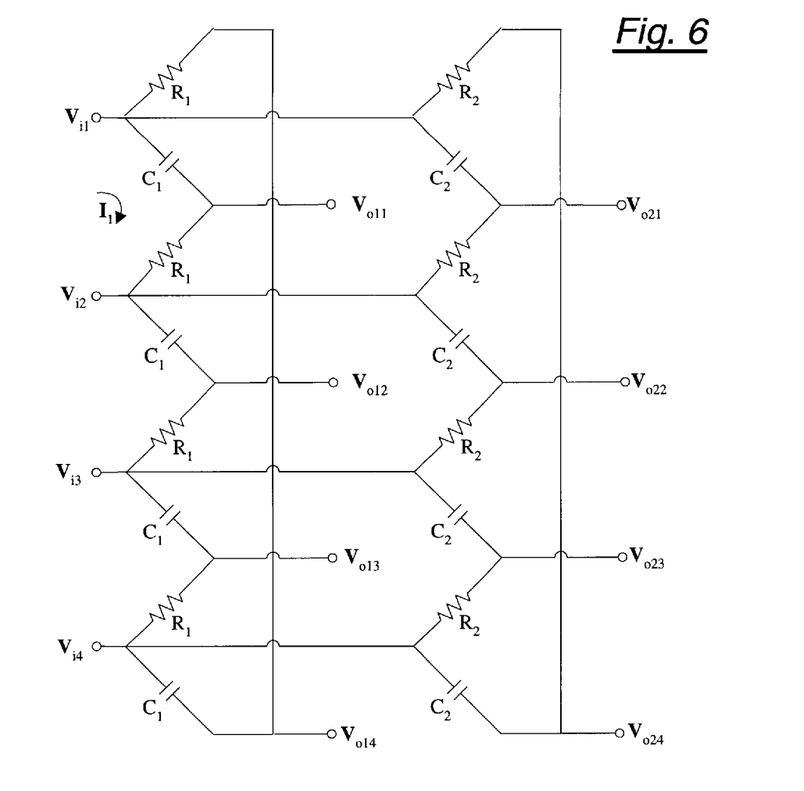
FIG. 6 is a circuit diagram of an eight-phase 45° polyphase filter with four inputs.

FIG. 6 is a circuit diagram similar to FIG. 5, but there are four inputs $V_{i1}$, $V_{i2}$, $V_{i3}$ and $V_{i4}$. The intermediate points which were virtual grounds in FIG. 5 are additional voltage inputs in FIG. 6. In the circuit of FIG. 6, for an unloaded filter $$V_{o11} - V_{i2} = I_1 R_1 = \frac{(V_{i1} - V_{i2})R_1}{R_1 + \frac{1}{j\omega C_1}} = (V_{i1} - V_{i2})\frac{j\omega R_1 C_1}{1 + j\omega R_1 C_1}$$

$$V_{o11} = V_{i1}\frac{j\omega R_1 C_1}{1 + j\omega R_1 C_1} + V_{i2}\left(1 - \frac{j\omega R_1 C_1}{1 + j\omega R_1 C_1}\right)$$

$$= V_{i1}\frac{j\omega R_1 C_1}{1 + j\omega R_1 C_1} + V_{i2}\frac{1}{1 + j\omega R_1 C_1}$$

Similarly, the other seven outputs in FIG. 6 can be expressed in terms of the inputs as follows:

$$V_{o12} = V_{i2}\frac{j\omega R_1 C_1}{1 + j\omega R_1 C_1} + V_{i3}\frac{1}{1 + j\omega R_1 C_1}$$

$$V_{o13} = V_{i3}\frac{j\omega R_1 C_1}{1 + j\omega R_1 C_1} + V_{i4}\frac{1}{1 + j\omega R_1 C_1}$$

$$V_{o14} = V_{i4}\frac{j\omega R_1 C_1}{1 + j\omega R_1 C_1} + V_{i1}\frac{1}{1 + j\omega R_1 C_1}$$

$$V_{o21} = V_{i1}\frac{j\omega R_2 C_2}{1 + j\omega R_2 C_2} + V_{i2}\frac{1}{1 + j\omega R_2 C_2}$$

$$V_{o22} = V_{i2}\frac{j\omega R_2 C_2}{1 + j\omega R_2 C_2} + V_{i3}\frac{1}{1 + j\omega R_2 C_2}$$

$$V_{o23} = V_{i3}\frac{j\omega R_2 C_2}{1 + j\omega R_2 C_2} + V_{i4}\frac{1}{1 + j\omega R_2 C_2}$$

$$V_{o24} = V_{i4}\frac{j\omega R_2 C_2}{1 + j\omega R_2 C_2} + V_{i1}\frac{1}{1 + j\omega R_2 C_2}$$

Each output has a contribution from two inputs. The transfer functions applied to the two inputs have the same denominator, and the numerator of one transfer function is entirely "real" and the numerator of the other transfer function is entirely "imaginary."

If $V_{i2}$ leads $V_{i1}$ by 90°, then each of those inputs will add in-phase for $V_{o11}$ and each of those inputs will add in-phase for $V_{o21}$. Similarly, if each input leads the preceding input by 90°, then the two inputs to each output will add in-phase.

Continuing with the circuit of FIG. 6, if, in addition to leading the preceding input by 90°, each of the inputs $V_{i1}$, $V_{i2}$, $V_{i3}$ and $V_{i4}$ has the same amplitude, then $$V_{i2} = jV_{i1},$$

$$V_{i3} = jV_{i2} = -V_{i1}, \text{ and}$$

$$V_{i4} = jV_{i3} = -jV_{i1}.$$

In that case, $$V_{o11} = jV_{i1}\frac{1 + \omega R_1 C_1}{1 + j\omega R_1 C_1}$$

$$V_{o12} = -V_{i1}\frac{1 + \omega R_1 C_1}{1 + j\omega R_1 C_1}$$

$$V_{o13} = -jV_{i1}\frac{1 + \omega R_1 C_1}{1 + j\omega R_1 C_1}$$

$$V_{o14} = V_{i1}\frac{1 + \omega R_1 C_1}{1 + j\omega R_1 C_1}$$

$$V_{o21} = jV_{i1}\frac{1 + \omega R_2 C_2}{1 + j\omega R_2 C_2}$$

$$V_{o22} = -V_{i1}\frac{1 + \omega R_2 C_2}{1 + j\omega R_2 C_2}$$

$$V_{o23} = -jV_{i1}\frac{1 + \omega R_2 C_2}{1 + j\omega R_2 C_2}$$

$$V_{o24} = V_{i1}\frac{1 + \omega R_2 C_2}{1 + j\omega R_2 C_2}$$

Each of outputs $V_{o11}$, $V_{o12}$, $V_{o13}$ and $V_{o14}$ will have the same amplitude, and each of outputs $V_{o21}$, $V_{o22}$, $V_{o23}$ and $V_{o24}$ will have the same amplitude. The ratio of $V_{o11}$ to $V_{o21}$ is $$\frac{(1 + \omega R_1 C_1)(1 + j\omega R_2 C_2)}{(1 + j\omega R_1 C_1)(1 + \omega R_2 C_2)} = \frac{(1 + \omega R_1 C_1) + j(\omega^2 R_1 C_1 R_2 C_2 + \omega R_2 C_2)}{(1 + \omega R_2 C_2) + j(\omega^2 R_1 C_1 R_2 C_2 + \omega R_1 C_1)}$$

If $R_1 C_1 R_2 C_2 = 1/\omega^2$, then the ratio of $V_{o11}$ to $V_{o21}$ is $$\frac{(1 + \omega R_1 C_1) + j(1 + \omega R_2 C_2)}{(1 + \omega R_2 C_2) + j(1 + \omega R_1 C_1)}$$

The absolute value of both numerator and the denominator is the same, $V_{o11}$ and $V_{o21}$ have the same amplitude, and all eight of the outputs will have the same amplitude.

Therefore, for an unloaded filter, the eight outputs in the circuit of FIG. 6 will be amplitude matched, each of outputs $V_{o11}$, $V_{o12}$, $V_{o13}$ and $V_{o14}$ will lead the previous output by 90°, and each of outputs $V_{o21}$, $V_{o22}$, $V_{o23}$ and $V_{o24}$ will lead the previous output by 90°, if $R_1 C_1 R_2 C_2 =$ $$R_1 C_1 R_2 C_2 = \frac{1}{\omega^2}$$

and each of the inputs $V_{i1}$, $V_{i2}$, $V_{i3}$ and $V_{i4}$ has the same amplitude and leads the preceding input by 90°. In addition, if $$\frac{R_1 C_1}{R_2 C_2} \cong 5.7,$$

then the phase angles of $V_{o11}$, $V_{o21}$, $V_{o12}$, $V_{o22}$, $V_{o13}$, $V_{o23}$, $V_{o14}$ and $V_{o24}$ will be 22.5°, 67.5°, 112.5°, 157.5°, 202.5°, 247.5°, 292.5° and 337.5°, respectively, with respect to $(V_{i1} - V_{i2})$. This would be the eight-phase 45° phase splitting with amplitude matching which is sought. Since $(V_{i1} - V_{i2}) = (1-j)V_{i1}$, $(V_{i1} - V_{i2})$ lags $V_{i1}$ by 45°.

Figure 7:
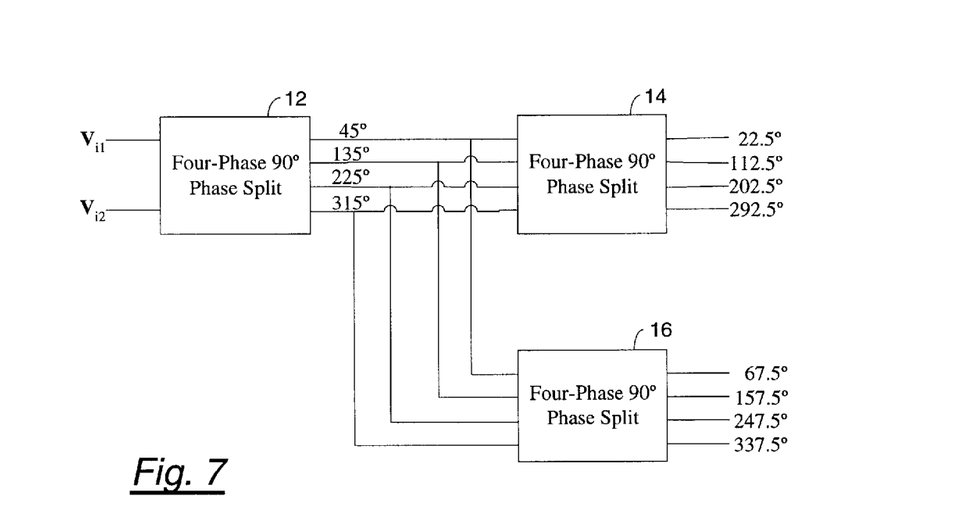
FIG. 7 is a block diagram illustrating an example of phase-splitting to achieve an eight-phase 45° phase split with amplitude matching.

FIG. 7 is a block diagram illustrating an example of phase-splitting to achieve an eight-phase 45° phase split with amplitude matching. Two signals $V_{i1}$ and $V_{i2}$, of equal amplitude and 180° out of phase with each other, can be split (12) to four intermediate signals of equal amplitude, each one of which is 90° out of phase with the next one of the four signals. The second input, $V_{i2}$, can already be available in some embodiments and, in other embodiments, can readily be obtained by inverting $V_{i1}$ as is well known in the art. In one embodiment, the amplitude matching of the resulting four intermediate signals can be achieved for a particular frequency by appropriate selection of component values in a four-phase 90° polyphase filter. The amplitude-matched point can result in the four intermediate signals having phase angles of 45°, 135°, 225°, and 315° with respect to $V_{i1}$ in FIG. 7. This was explained regarding the circuit illustrated in FIG. 4.

The four intermediate signals can be converted (14) to a first group of four output signals, each one of which is 90° out of phase with the next one. The four intermediate signals also can be converted (16) to a second group of four output signals, each one of which is 90° out of phase with the next one. The first and second groups of output signals in FIG. 7 can be offset from each other, respectively, by 45°. This was explained regarding the circuit illustrated in FIG. 5. For an unloaded filter, in one embodiment, this can be achieved for a particular frequency by appropriate selection of component values in two four-phase 90° polyphase filters with the same input signals. This can result in the eight output signals having phase angles of 22.5°, 67.5°, 112.5°, 157.5°, 202.5°, 247.5°, 292.5°, and 337.5° with respect to $V_{i1}$. Amplitude matching of the eight output signals in FIG. 7 can be achieved because of the amplitude matching of the four intermediate signals. This was explained regarding the circuit illustrated in FIG. 6.

Figure 8:
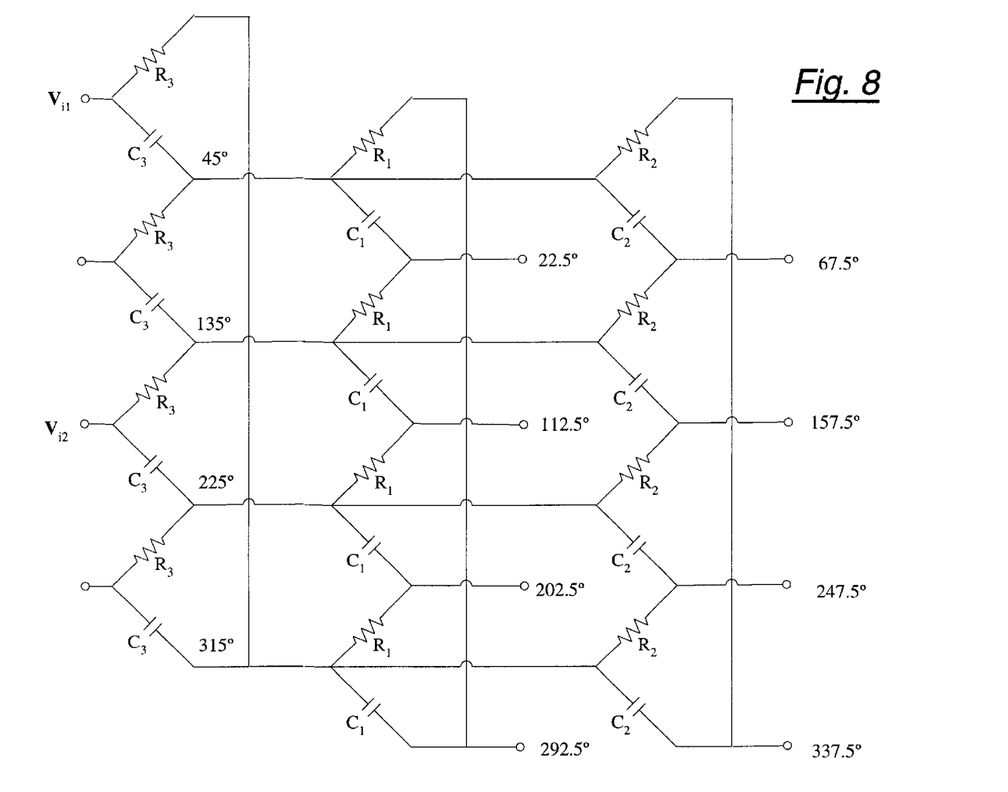
FIG. 8 is a circuit diagram of an eight-phase 45° polyphase filter with two inputs.

FIG. 8 is a circuit diagram of a differential eight-phase 45° polyphase filter, implementing the block diagram of FIG. 7. Inputs $V_{i1}$ and $V_{i2}$ are of equal amplitude and 180° out of phase with each other. The first stage is similar to the circuit of FIG. 4. When $$\omega = \frac{1}{R_3 C_3},$$

the four outputs of the first stage (i.e., the intermediate signals which are inputs to the second stage) will be 90° phase-split and amplitude matched. These are the input conditions discussed above for one example of the circuit of FIG. 6. The first stage outputs (second stage inputs) will have phase angles of 45°, 135°, 225° and 315° with respect to $V_{i1}$.

The second stage of the circuit of FIG. 8 is similar to the circuit of FIG. 6. For an unloaded filter, when $$\omega = \frac{1}{R_3 C_3}, R_1 C_1 R_2 C_2 = \frac{1}{\omega^2}, \text{ and } \frac{R_1 C_1}{R_2 C_2} \cong 5.7,$$

the second stage outputs will be 45° phase-split and amplitude matched. They will have phase angles of 22.5°, 67.5°, 112.5°, 157.5°, 202.5°, 247.5°, 292.5° and 337.5° with respect to $V_{i1}$.

Figure 9A:
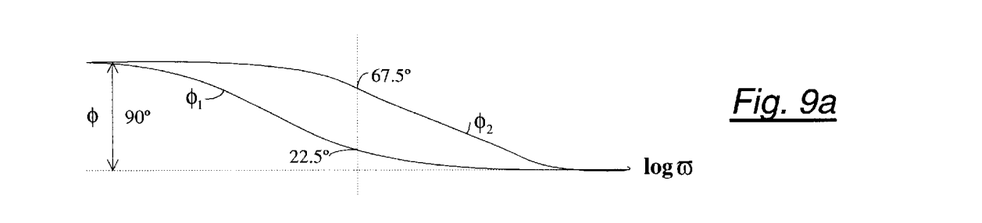
FIG. 9a is a graph representing phase angle (between an output and an input) versus frequency.

FIG. 9a is an illustration representing a plot of phase angle φ (between an output and an input in the circuit of FIG.

8) versus log ω. As illustrated in FIG. 2, a phase angle φ=arctan(1/ωRC). The phase angle φ approaches 90° asymptotically as 1/ωRC increases and is effectively a constant 90° when ω is less than about an order of magnitude less than 1/RC. The phase angle φ approaches 0° asymptotically as 1/ωRC decreases and is effectively a constant 0° when ω is more than about an order of magnitude more than 1/RC. The change in φ for a given change in ω is greatest when ω=1/RC, and φ=45°. It is also relatively constant around φ=45°, and then diminishes toward zero as φ approaches 0° or 90°.

FIG. 9a is an illustration of two plots, φ₁ and φ₂, representing the phase angle for two different values of RC, $R_1C_1$ and $R_2C_2$, respectively. If $R_1C_1=(K)(R_2C_2)$ where K is a constant, then $φ_1$ for $ω=ω_a$ has the same value as $φ_2$ for $ω=(1/K)ω_a$, since φ=arctan(1/ωRC). Since log((1/K)ω)=log ω+log (1/K), and since log (1/K) is a constant, the plot representing $φ_1$ is just a translation along the log ω axis of the plot representing $φ_2$.

Figure 9B:
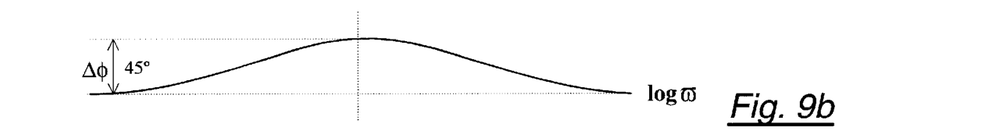
FIG. 9b is a graph representing the difference between the phase angles of two outputs versus frequency.

FIG. 9b is an illustration representing a plot of the difference in phase angle Δφ between $φ_2$ and $φ_1$ in FIG. 9a versus log ω. If $$\frac{R_1 C_1}{R_2 C_2} \cong 5.7,$$

then $φ_1$ will be 22.5° when $φ_2$ is 67.5°. This was explained regarding the circuit illustrated in FIG. 5. In that case, Δφ would peak at that point and would equal 45°. As ω changes in either direction from that point, one of the two phase angles ($φ_1$ or $φ_2$) will move closer to 45° and the other will move further away. For a given change in ω, the phase angle getting closer to 45° will increase (or decrease) more than the other phase angle, and Δφ will decrease as represented in FIG. 9b.

For the 22.5°/67.5° phase-split at the operating frequency, Δφ remains relatively flat over a wide band (approximately the desired operating frequency ±50%). However, a circuit such as in FIG. 5 would have a severe amplitude mismatch at its output as a consequence of the offset nature of the two RC constants. The addition of the first stage, as in the example of FIG. 8 permits the eight-phase 45° split with amplitude matching. The first stage distributes power evenly among the four inputs to the second stage, cancelling out the uneven distribution which would occur otherwise in the second stage.

The circuits discussed above were analyzed in a voltage mode, but the same principles apply to current mode signals. Using current inputs and outputs would result in the same phase splitting and amplitude matching.

While various embodiments of the application have been described, it will be apparent to those of ordinary skill in the art that many more embodiments and implementations are possible that are within the scope of the invention. Accordingly, the invention is not to be restricted except in light of the attached claims and their equivalents.

What is claimed is:

1. A polyphase filter comprising:
   a first four-phase 90° phase splitter with four outputs;
   a second four-phase 90° phase splitter, with four inputs coupled respectively to the four outputs of the first phase splitter; and
   a third four-phase 90° phase splitter, with four inputs coupled respectively to the four outputs of the first phase splitter.

2. The polyphase filter as in claim 1, the first phase splitter further comprising:
   four first resistors of a substantially equal resistance value;
   four first capacitors of a substantially equal capacitance value; and
   where each one of the four first resistors follows one of the first four capacitors, respectively, in a series loop.

3. The polyphase filter as in claim 2, where a product, of the resistance value times the capacitance value, is close in value to a ratio of one divided by a desired operating frequency, when the operating frequency is expressed in radians.

4. The polyphase filter as in claim 1, the second phase splitter further comprising:
   four second resistors of a substantially equal resistance value;
   four second capacitors of a substantially equal capacitance value;
   where each one of the four second resistors follows one of the second four capacitors, respectively, in a series loop; and
   the third phase splitter further comprising:
   four third resistors of a substantially equal resistance value;
   four third capacitors of a substantially equal capacitance value; and
   where each one of the four third resistors follows one of the third four capacitors, respectively, in a series loop.

5. The polyphase filter as in claim 4, where a product, of tan 22.5° times the resistance value of the second resistors times the capacitance value of the second capacitors, is close in value to a ratio of one divided by a desired operating frequency, when the operating frequency is expressed in radians; and
   where a product, of tan 67.5° times the resistance value of the third resistors times the capacitance value of the third capacitors, is close in value to a ratio of one divided by the desired operating frequency, when the operating frequency is expressed in radians.

6. The polyphase filter as in claim 4, where the resistance value of the second resistors times the capacitance value of the second capacitors defines a second product;
   where the resistance value of the third resistors times the capacitance value of the third capacitors defines a third product;
   where a ratio of the second product divided by the third product is close in value to a ratio of tan 67.5° divided by tan 22.5°; and
   where a product of the second product times the third product is close in value to a ratio of one divided by a square of a desired operating frequency, when the operating frequency is expressed in radians.

7. A polyphase filter comprising:
   means for splitting two signals into four intermediate signals, each one of the four intermediate signals being of a substantially equal amplitude as a next one of the four intermediate signals, and each one of the four intermediate signals being substantially 90° out of phase with the next one of the four intermediate signals; and
   means for converting the four intermediate signals into eight output signals, each one of the eight output signals being of a substantially equal amplitude as a next one of the eight output signals, and each one of the eight output signals being substantially 45° out of phase with the next one of the eight output signals.

8. A polyphase filter as in claim 7, further comprising:
means for providing the two signals, where the two signals are of substantially equal amplitude and substantially 180° out of phase with each other.

9. A polyphase filter as in claim 7, the converting means further comprising:
means for converting the four intermediate signals to a first group of four output signals, each one of which is substantially 90° out of phase with a next one of the first group of four output signals; and
means for converting the four intermediate signals to a second group of four output signals, each one of which is substantially 90° out of phase with a next one of the second group of four output signals.

10. A polyphase filter as in claim 9, where each one of the four output signals of the first group is substantially 45° out of phase with a next one of the four output signals of the second group, respectively.

11. A method of signal phase-splitting, the method comprising:
splitting two signals into four intermediate signals, each one of the four intermediate signals being of a substantially equal amplitude as a next one of the four intermediate signals, and each one of the four intermediate signals being substantially 90° out of phase with the next one of the four intermediate signals; and
converting the four intermediate signals into eight output signals, each one of the eight output signals being of a substantially equal amplitude as a next one of the eight output signals, and each one of the eight output signals being substantially 45° out of phase with the next one of the eight output signals.

12. A method as in claim 11, where the two signals are of substantially equal amplitude and substantially 180° out of phase with each other.

13. A method as in claim 11, further comprising providing a second one of the two signals by inverting a first one of the two signals.

14. A method as in claim 11, the converting step further comprising:
converting the four intermediate signals to a first group of four output signals, each one of which is substantially 90° out of phase with a next one of the first group of four output signals; and
converting the four intermediate signals to a second group of four output signals, each one of which is substantially 90° out of phase with a next one of the second group of four output signals.

15. A method as in claim 14, where each one of the four output signals of the first group is substantially 45° out of phase with a next one of the four output signals of the second group, respectively.

16. The method as in claim 11, the splitting step further comprising:
inputting the two signals to a first four-phase 90° phase splitter, where the first phase splitter comprises four first resistors and four first capacitors in a series loop, each one of the four first resistors being followed in the series loop by one of the four first capacitors, respectively, each of the four first resistors being of a substantially equal resistance value, and each of the four first capacitors being of a substantially equal capacitance value.

17. The method as in claim 16, where a product, of the resistance value times the capacitance value, is close in value to a ratio of one divided by a desired operating frequency, when the operating frequency is expressed in radians.

18. A method as in claim 11, where the converting step further comprises:
inputting the four intermediate signals to a second four-phase 90° phase splitter; and
inputting the four intermediate signals to a third four-phase 90° phase splitter.

19. The method as in claim 18, where the second phase splitter comprises four second resistors and four second capacitors in a series loop, each one of the four second resistors being followed in the series loop by one of the four second capacitors, respectively, each of the four second resistors being of a substantially equal resistance value, and each of the four second capacitors being of a substantially equal capacitance value; and
where the third phase splitter comprises four third resistors and four third capacitors in a series loop, each one of the four third resistors being followed in the series loop by one of the four third capacitors, respectively, each of the four third resistors being of a substantially equal resistance value, and each of the four third capacitors being of a substantially equal capacitance value.

20. The method as in claim 19, where a product, of tan 22.5° times the resistance value of the second resistors times the capacitance value of the second capacitors, is close in value to a ratio of one divided by a desired operating frequency, when the operating frequency is expressed in radians; and
where a product, of tan 67.5° times the resistance value of the third resistors times the capacitance value of the third capacitors, is close in value to a ratio of one divided by the desired operating frequency, when the operating frequency is expressed in radians.

21. The method as in claim 19, where a second product, of the resistance value of the second resistors times the capacitance value of the second capacitors, and a third product, of the resistance value of the third resistors times the capacitance value of the third capacitors, result in:
a ratio of the second product divided by the third product being close in value to a ratio of tan 67.5° divided by tan 22.5°; and
a product of the second product times the third product being close in value to one divided by a square of a desired operating frequency, when the operating frequency is expressed in radians.

* * * * *

UNITED STATES PATENT AND TRADEMARK OFFICE
CERTIFICATE OF CORRECTION

PATENT NO. : 6,388,543 B1
DATED : May 14, 2002
INVENTOR(S) : Molnar et al.

It is certified that error appears in the above-identified patent and that said Letters Patent is hereby corrected as shown below:

Column 2,
Line 31, delete "$V_i$" and insert therefor -- $\mathbf{V_i}$ --.
Line 32, delete "I" and insert therefor -- $\mathbf{I}$ --.
Line 34, delete "IR" and insert therefor -- $\mathbf{IR}$ --.
Line 35, delete "$I(1/j\omega C)$. $V_i = IR + I(1/j\omega C)$." and insert therefor -- $\mathbf{I}(1/j\omega C)$. $\mathbf{V_i} = \mathbf{IR} + \mathbf{I}(1/j\omega C)$. --.
Line 36, delete "IR, always leads $V_i$" and insert therefor IR, always leads -- $\mathbf{V_i}$ --.
Line 37, delete "C, $I(1/j\omega C)$, always lags IR" and insert therefor -- C, $\mathbf{I}(1/j\omega C)$, always lags $\mathbf{IR}$ --.
Line 41, delete "leads $V_i$, by 45° and the voltage across C lags $V_i$" and insert therefor -- $\mathbf{V_i}$ by 45° and the voltage across C lags $\mathbf{V_i}$ --.
Lines 45-58, delete the equations printed and replace them with the following:

$$\mathbf{V_i} = \mathbf{V_{i1}} - \mathbf{V_a}$$

$$\mathbf{I_1} = \mathbf{I_2} = \frac{\mathbf{V_i}}{R + \frac{1}{j\omega C}}$$

$$\mathbf{V_1} = \mathbf{V_{o1}} - \mathbf{V_a} = \mathbf{I_1}\left(\tfrac{1}{j\omega C}\right) = \frac{\mathbf{V_i}}{R + \frac{1}{j\omega C}}\left(\tfrac{1}{j\omega C}\right) = \mathbf{V_i}\frac{1}{1 + j\omega RC}$$

$$\mathbf{V_2} = \mathbf{V_{o2}} - \mathbf{V_a} = \mathbf{I_2} R = \frac{\mathbf{V_i}}{R + \frac{1}{j\omega C}} R = \mathbf{V_i}\frac{j\omega RC}{1 + j\omega RC} = \mathbf{V_1}(j\omega RC)$$

Column 2,
Line 59, delete "$V_1$ and $V_2$" and insert therefor -- $\mathbf{V_1}$ and $\mathbf{V_2}$ --.
Line 61, delete "$V_1$ and $V_2$" and insert therefor -- $\mathbf{V_1}$ and $\mathbf{V_2}$ --.
Line 63, delete "$V_1$ and $V_2$ with respect to $V_i$" and insert therefor -- $\mathbf{V_1}$ and $\mathbf{V_2}$ with respect to $\mathbf{V_i}$ --.
Line 67, delete "$V_{i1}$ and $V_{i2}$" and insert therefor -- $\mathbf{V_{i1}}$ and $\mathbf{V_{i2}}$ --.

UNITED STATES PATENT AND TRADEMARK OFFICE
CERTIFICATE OF CORRECTION

PATENT NO.    : 6,388,543 B1
DATED         : May 14, 2002
INVENTOR(S)   : Molnar et al.

It is certified that error appears in the above-identified patent and that said Letters Patent is hereby corrected as shown below:

Column 3,
Line 1, please delete "$V_{i1} = -V_{i2},$" and insert therefor
-- $\mathbf{V_{i1} = -V_{i2}}$, --.
Line 6, delete "$Vo1$ lags $V_{o2}$ by 90°, and they straddle $V_{i1}$" and insert therefor -- $\mathbf{V_{o1}}$ lags $\mathbf{V_{o2}}$ by 90°, and they straddle $\mathbf{V_{i1}}$ --.
Line 7, delete "$V_{o3}$ lags $V_{o4}$" and insert therefor -- $\mathbf{V_{o3}}$ lags $\mathbf{V_{o4}}$ --.
Line 8, delete "$V_{i2}$" and insert therefor -- $\mathbf{V_{i2}}$ --.
Line 10, delete "$V_{o1}$ and $V_{o2}$ are 180° out of phase with $V_{o3}$" and insert therefor -- $\mathbf{V_{o1}}$ and $\mathbf{V_{o2}}$ are 180° out of phase with $\mathbf{V_{o3}}$ --.
Line 11, delete "$V_{o4}$" and insert therefor -- $\mathbf{V_{o4}}$ --.
Line 14, delete "$V_{o1}, V_{o2}, V_{o3}$ and $V_{o4}$" and insert therefor
-- $\mathbf{V_{o1}, V_{o2}, V_{o3}}$ and $\mathbf{V_{o4}}$ --.
Line 16, delete "$V_{i1}$" and insert therefor -- $\mathbf{V_{i1}}$ --.
Line 22, delete "$V_{i1}$ and $V_{i2}$" and insert therefor -- $\mathbf{V_{i1}}$ and $\mathbf{V_{i2}}$ --.
Line 24, delete "$V_{o11}, V_{o12}, V_{o13}$ and $V_{o14}$" and insert therefor
-- $\mathbf{V_{o11}, V_{o12}, V_{o13}}$ and $\mathbf{V_{o14}}$ --.
Line 25, delete "$V_{o21}, V_{o22},$" and insert therefor -- $\mathbf{V_{o21}, V_{o22}}$, --.
Line 26, delete "$V_{o23}$ and $V_{o24}$" and insert therefor
-- $\mathbf{V_{o23}}$ and $\mathbf{V_{o24}}$ --.
Line 32, delete "$V_{o21}, V_{o22}, V_{o23}$ and $V_{o24}$" and insert therefor
-- $\mathbf{V_{o21}, V_{o22}, V_{o23}}$ and $\mathbf{V_{o24}}$ --.
Line 33, delete "$V_{o11}, V_{o12}, V_{o13}$ and $V_{o14}$," and insert therefor
-- $\mathbf{V_{o11}, V_{o12}, V_{o13}}$ and $\mathbf{V_{o14}}$, --.
Line 35, delete "$V_{o11}$, leads $V_{i1}$ by 22.5° when $1/\omega R_1 C_1 = \tan 22.50 = 0.41421$," and insert therefor -- $\mathbf{V_{o11}}$ leads $\mathbf{V_{i1}}$ by 22.5° when $1/\omega R_1 C_1 = \tan 22.5\ ° = 0.41421$, --.
Line 36, delete "$V_{o21}$ leads $V_{i1}$" and insert therefor -- $\mathbf{V_{o21}}$ leads $\mathbf{V_{i1}}$ --.
Line 38, delete "$V_{o11}, V_{o21}, V_{o12}, V_{o22}, V_{o13}, V_{o23}, V_{o14}$ and $V_{o24}$" and insert therefor
-- $\mathbf{V_{o11}, V_{o21}, V_{o12}, V_{o22}, V_{o13}, V_{o23}, V_{o14}}$ and $\mathbf{V_{o24}}$ --.
Line 40, delete "$V_{i1}$" and insert therefor -- $\mathbf{V_{i1}}$ --.

Column 4,
Line 13, delete "$V_{i1}$" and insert therefor -- $\mathbf{V_{i1}}$ --.
Line 14, delete "$V_{i2}$" and insert therefor -- $\mathbf{V_{i2}}$ --.
Line 16, delete "$\omega=$ ".
Line 24, delete "$V_{i1}, V_{i2}, V_{i3}$ and $V_{i4}$" and insert therefor -- $\mathbf{V_{i1}, V_{i2}, V_{i3}}$ and $\mathbf{V_{i4}}$ --.

UNITED STATES PATENT AND TRADEMARK OFFICE
CERTIFICATE OF CORRECTION

PATENT NO. : 6,388,543 B1
DATED : May 14, 2002
INVENTOR(S) : Molnar et al.

It is certified that error appears in the above-identified patent and that said Letters Patent is hereby corrected as shown below:

<u>Column 4 cont'd,</u>
Lines 28-38, delete the equations printed and replace them with the following:

$$\mathbf{V_{o11}} - \mathbf{V_{i2}} = \mathbf{I_1} R_1 = \frac{(\mathbf{V_{i1}} - \mathbf{V_{i2}}) R_1}{R_1 + \frac{1}{j\omega C_1}} = (\mathbf{V_{i1}} - \mathbf{V_{i2}}) \frac{j\omega R_1 C_1}{1 + j\omega R_1 C_1}$$

$$\mathbf{V_{o11}} = \mathbf{V_{i1}} \frac{j\omega R_1 C_1}{1 + j\omega R_1 C_1} + \mathbf{V_{i2}} \left(1 - \frac{j\omega R_1 C_1}{1 + j\omega R_1 C_1}\right)$$

$$= \mathbf{V_{i1}} \frac{j\omega R_1 C_1}{1 + j\omega R_1 C_1} + \mathbf{V_{i2}} \frac{1}{1 + j\omega R_1 C_1}$$

Lines 41-58, delete the equations printed and replace them with the following:

$$\mathbf{V_{o12}} = \mathbf{V_{i2}} \frac{j\omega R_1 C_1}{1 + j\omega R_1 C_1} + \mathbf{V_{i3}} \frac{1}{1 + j\omega R_1 C_1}$$

$$\mathbf{V_{o13}} = \mathbf{V_{i3}} \frac{j\omega R_1 C_1}{1 + j\omega R_1 C_1} + \mathbf{V_{i4}} \frac{1}{1 + j\omega R_1 C_1}$$

$$\mathbf{V_{o14}} = \mathbf{V_{i4}} \frac{j\omega R_1 C_1}{1 + j\omega R_1 C_1} + \mathbf{V_{i1}} \frac{1}{1 + j\omega R_1 C_1}$$

$$\mathbf{V_{o21}} = \mathbf{V_{i1}} \frac{j\omega R_2 C_2}{1 + j\omega R_2 C_2} + \mathbf{V_{i2}} \frac{1}{1 + j\omega R_2 C_2}$$

$$\mathbf{V_{o22}} = \mathbf{V_{i2}} \frac{j\omega R_2 C_2}{1 + j\omega R_2 C_2} + \mathbf{V_{i3}} \frac{1}{1 + j\omega R_2 C_2}$$

$$\mathbf{V_{o23}} = \mathbf{V_{i3}} \frac{j\omega R_2 C_2}{1 + j\omega R_2 C_2} + \mathbf{V_{i4}} \frac{1}{1 + j\omega R_2 C_2}$$

$$\mathbf{V_{o24}} = \mathbf{V_{i4}} \frac{j\omega R_2 C_2}{1 + j\omega R_2 C_2} + \mathbf{V_{i1}} \frac{1}{1 + j\omega R_2 C_2}$$

UNITED STATES PATENT AND TRADEMARK OFFICE
CERTIFICATE OF CORRECTION

PATENT NO.    : 6,388,543 B1
DATED         : May 14, 2002
INVENTOR(S)   : Molnar et al.

It is certified that error appears in the above-identified patent and that said Letters Patent is hereby corrected as shown below:

Column 4 cont'd,
Line 64, delete "$V_{i2}$ leads $V_{i1}$" and insert therefor -- $\mathbf{V_{i2}}$ leads $\mathbf{V_{i1}}$ --.
Line 65, delete "$V_{o11}$" and insert therefor -- $\mathbf{V_{o11}}$ --.
Line 66, delete "$V_{o21}$" and insert therefor -- $\mathbf{V_{o21}}$ --.

Column 5,
Line 2, delete "$V_{i1}$," and insert therefor -- $\mathbf{V_{i1}}$, --.
Line 3, delete "$V_{i2}$, $V_{i3}$ and $V_{i4}$" and insert therefor -- $\mathbf{V_{i2}}$, $\mathbf{V_{i3}}$ and $\mathbf{V_{i4}}$ --.
Lines 4-9, delete the equations printed and replace them with the following:

$$\mathbf{V_{i2}} = j\mathbf{V_{i1}},$$

$$\mathbf{V_{i3}} = j\mathbf{V_{i2}} = -\mathbf{V_{i1}}, \text{ and}$$

$$\mathbf{V_{i4}} = j\mathbf{V_{i3}} = -j\mathbf{V_{i1}}.$$

Lines 11-29, delete the equations printed and replace them with the following:

$$\mathbf{V_{o11}} = j\mathbf{V_{i1}} \frac{1+\omega R_1 C_1}{1+j\omega R_1 C_1}$$

$$\mathbf{V_{o12}} = -\mathbf{V_{i1}} \frac{1+\omega R_1 C_1}{1+j\omega R_1 C_1}$$

$$\mathbf{V_{o13}} = -j\mathbf{V_{i1}} \frac{1+\omega R_1 C_1}{1+j\omega R_1 C_1}$$

$$\mathbf{V_{o14}} = \mathbf{V_{i1}} \frac{1+\omega R_1 C_1}{1+j\omega R_1 C_1}$$

$$\mathbf{V_{o21}} = j\mathbf{V_{i1}} \frac{1+\omega R_2 C_2}{1+j\omega R_2 C_2}$$

$$\mathbf{V_{o22}} = -\mathbf{V_{i1}} \frac{1+\omega R_2 C_2}{1+j\omega R_2 C_2}$$

$$\mathbf{V_{o23}} = -j\mathbf{V_{i1}} \frac{1+\omega R_2 C_2}{1+j\omega R_2 C_2}$$

$$\mathbf{V_{o24}} = \mathbf{V_{i1}} \frac{1+\omega R_2 C_2}{1+j\omega R_2 C_2}$$

UNITED STATES PATENT AND TRADEMARK OFFICE
CERTIFICATE OF CORRECTION

PATENT NO. : 6,388,543 B1
DATED : May 14, 2002
INVENTOR(S) : Molnar et al.

It is certified that error appears in the above-identified patent and that said Letters Patent is hereby corrected as shown below:

<u>Column 5 cont'd,</u>
Line 31, delete "$V_{o11}, V_{o12}, V_{o13},$ and $V_{o14}$" and insert therefor
-- $\mathbf{V_{o11}, V_{o12}, V_{o13}}$ and $\mathbf{V_{o14}}$ --.
Line 32, delete "$V_{o21}, V_{o22}, V_{o23}$" and insert therefor
-- $\mathbf{V_{o21}, V_{o22}, V_{o23}}$ --.
Line 34, delete "$V_{o24}$" and insert therefor -- $\mathbf{V_{o24}}$ --.
Line 34, delete "The ratio of $V_{o11}$ to $V_{o21}$" and insert therefor
-- The ratio of $\mathbf{V_{o11}}$ to $\mathbf{V_{o21}}$ --.
Lines 36-39, delete the equation printed and replace it with the following:

$$\frac{(1+\omega R_1 C_1)(1+j\omega R_2 C_2)}{(1+j\omega R_1 C_1)(1+\omega R_2 C_2)} = \frac{(1+\omega R_1 C_1)+j(\omega^2 R_1 C_1 R_2 C_2 + \omega R_2 C_2)}{(1+\omega R_2 C_2)+j(\omega^2 R_1 C_1 R_2 C_2 + \omega R_1 C_1)}$$

Line 40, delete "$V_{o11}$, to $V_{o21}$" and insert therefor -- $\mathbf{V_{o11}}$ to $\mathbf{V_{o21}}$ --.
Lines 42-44, delete the expression printed and replace it with the following:

$$\frac{(1+\omega R_1 C_1)+j(1+\omega R_2 C_2)}{(1+\omega R_2 C_2)+j(1+\omega R_1 C_1)}$$

Line 47, delete "$V_{o11}$ and $V_{o21}$" and insert
therefor -- $\mathbf{V_{o11}}$ and $\mathbf{V_{o21}}$ --.
Line 51, delete "$V_{o11}, V_{o12}, V_{o13}$ and $V_{o14}$" and insert therefor
-- $\mathbf{V_{o11}, V_{o12}, V_{o13}}$ and $\mathbf{V_{o14}}$ --.
Line 52, delete "$V_{o21}, V_{o22}, V_{o23}$ and $V_{o24}$" and insert therefor
-- $\mathbf{V_{o21}, V_{o22}, V_{o23}}$ and $\mathbf{V_{o24}}$ --.
Line 53, delete "$R_1 C_1 R_2 C_2 =$".
Line 59, delete "$V_{i1}, V_{i2}, V_{i3}$ and $V_{i4}$" and insert therefor -- $\mathbf{V_{i1}, V_{i2}, V_{i3}}$ and $\mathbf{V_{i4}}$ --.
Line 66, delete "$V_{o11}, V_{o21}, V_{o12}, V_{o22}, V_{o13}, V_{o23},$" and
insert therefor -- $\mathbf{V_{o11}, V_{o21}, V_{o12}, V_{o22}, V_{o13}, V_{o23}}$, --.
Line 67, delete "$V_{o14}$ and $V_{o24}$" and insert therefor -- $\mathbf{V_{o14}}$ and $\mathbf{V_{o24}}$ --.

UNITED STATES PATENT AND TRADEMARK OFFICE
CERTIFICATE OF CORRECTION

PATENT NO. : 6,388,543 B1
DATED : May 14, 2002
INVENTOR(S) : Molnar et al.

It is certified that error appears in the above-identified patent and that said Letters Patent is hereby corrected as shown below:

Column 6,
Line 2, delete "$(V_{i1} - V_{i2})$." and insert therefor -- $(\mathbf{V_{i1}} - \mathbf{V_{i2}})$. --.
Line 3, delete "$(V_{i1} - V_{i2})$" and insert therefor -- $(\mathbf{V_{i1}} - \mathbf{V_{i2}}) =$ --.
Line 4, delete "$(1-j)V_{i1}$, $(V_{i1}-V_{i2})$ lags $V_{i1}$ by 45°." and insert therefor -- $(1-j)\mathbf{V_{i1}}$, $(\mathbf{V_{i1}} - \mathbf{V_{i2}})$ lags $\mathbf{V_{i1}}$ by 45°. --.
Line 7, delete "$V_{i1}$ and $V_{i2}$," and insert therefor -- $\mathbf{V_{i1}}$ and $\mathbf{V_{i2}}$,--.
Line 11, delete "$V_{i2}$," and insert therefor -- $\mathbf{V_{i2}}$, --.
Line 13, delete "$V_{i1}$" and insert therefor -- $\mathbf{V_{i1}}$ --.
Line 18, delete "$V_{i1}$" and insert therefor -- $\mathbf{V_{i1}}$ --.
Line 34, delete "$V_{i1}$." and insert therefor -- $\mathbf{V_{i1}}$. --.
Line 41, delete "$V_{i1}$ and $V_{i2}$" and insert therefor -- $\mathbf{V_{i1}}$ and $\mathbf{V_{i2}}$ --.
Line 55, delete "$V_{i1}$." and insert therefor -- $\mathbf{V_{i1}}$. --.
Line 65, delete "$V_{i1}$." and insert therefor -- $\mathbf{V_{i1}}$. --.

Signed and Sealed this

Twelfth Day of November, 2002

*Attest:*

*Attesting Officer*

JAMES E. ROGAN
*Director of the United States Patent and Trademark Office*